(12) United States Patent
Kadam

(10) Patent No.: US 9,553,567 B2
(45) Date of Patent: Jan. 24, 2017

(54) FAST SETTLING CHARGE PUMP WITH FREQUENCY HOPPING

(71) Applicant: TriQuint Semiconductor, Inc., Hillsboro, OR (US)

(72) Inventor: Dharma Reddy Kadam, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 632 days.

(21) Appl. No.: 13/908,781

(22) Filed: Jun. 3, 2013

(65) Prior Publication Data

US 2014/0354340 A1 Dec. 4, 2014

(51) Int. Cl.
| | | |
|---|---|---|
| *H04B 1/40* | (2015.01) | |
| *H03K 3/03* | (2006.01) | |
| *H02M 3/07* | (2006.01) | |
| *H02M 1/00* | (2006.01) | |

(52) U.S. Cl.
CPC .............. *H03K 3/0315* (2013.01); *H02M 3/07* (2013.01); *H02M 2001/0012* (2013.01)

(58) Field of Classification Search
CPC .............. H03K 3/00; H03K 3/02; G05F 1/10; H02M 3/07
USPC .............. 455/456.1, 41.1, 41.2, 41.3, 404.2, 414.2, 455/440, 457, 75, 76, 63.3, 71, 127.1; 327/299
See application file for complete search history.

(56) References Cited

U.S. PATENT DOCUMENTS

| | | | | |
|---|---|---|---|---|
| 6,650,721 B1 * | 11/2003 | Janesch | .................. | H03C 3/095 327/156 |
| 7,233,130 B1 * | 6/2007 | Kay | ...................... | H02M 1/143 323/222 |
| 2001/0017572 A1 * | 8/2001 | Harpham | .............. | H03L 7/0891 331/14 |
| 2002/0150151 A1 * | 10/2002 | Krone | ................. | H04L 25/0266 375/219 |
| 2006/0114072 A1 * | 6/2006 | Lee | .......................... | H03K 3/00 331/57 |
| 2006/0261880 A1 * | 11/2006 | Hidaka | ................... | H02M 3/07 327/536 |
| 2010/0166084 A1 * | 7/2010 | Galton | ................ | H03M 7/3002 375/245 |
| 2010/0246219 A1 * | 9/2010 | Ying | ...................... | H02M 1/44 363/74 |
| 2012/0182058 A1 * | 7/2012 | Yang | .................. | H03K 5/15013 327/295 |
| 2013/0154696 A1 * | 6/2013 | Chen | ....................... | H02M 3/07 327/157 |
| 2013/0200922 A1 * | 8/2013 | Hsueh | ................... | H03L 7/0891 327/12 |

(Continued)

OTHER PUBLICATIONS

Office Action for French Patent Application No. 1454901, mailed Nov. 3, 2014, 2 pages.

*Primary Examiner* — Md Talukder

(74) *Attorney, Agent, or Firm* — Withrow + Terranova, P.L.L.C.

(57) ABSTRACT

Embodiments provide, among other things, a circuit including a frequency generator and a charge pump. In embodiments, the frequency generator may be configured to provide the charge pump with a clock signal at a first frequency for a predefined period of time. Thereafter, the frequency generator may provide the charge pump with a clock signal at one or more other frequencies. In embodiments, the first frequency may enable the charge pump to settle in a reduced period of time when compared with the one or more other frequencies.

19 Claims, 6 Drawing Sheets

(56) References Cited

U.S. PATENT DOCUMENTS

| | | | | |
|---|---|---|---|---|
| 2014/0009203 A1* | 1/2014 | Cebi | .................... | H03K 17/162 |
| | | | | 327/379 |
| 2014/0302797 A1* | 10/2014 | Han | ..................... | H04W 24/06 |
| | | | | 455/67.14 |
| 2014/0354340 A1* | 12/2014 | Kadam | ................... | H02M 3/07 |
| | | | | 327/299 |

* cited by examiner

| Fastclkb | Four-bit Counter | | | | Q3_Next | Q2_Next | Q1_Next | Q0_Next | Oscillator | |
|---|---|---|---|---|---|---|---|---|---|---|
| | Q3 | Q2 | Q1 | Q0 | | | | | Freq1 (Mhz) | Freq2 (Mhz) |
| 0 | * | * | * | * | | | | | ? | ? |
| 1 | 0 | 0 | 0 | 0 | 0 | 0 | 0 | 0 | 3.22 | 1.962 |
| 1 | 1 | 0 | 0 | 0 | 1 | 0 | 0 | 1 | 1.962 | 0.702 |
| 1 | 0 | 0 | 0 | 1 | 0 | 0 | 1 | 1 | 0.702 | 2.142 |
| 1 | 1 | 0 | 0 | 1 | 0 | 0 | 1 | 0 | 2.142 | 0.882 |
| 1 | 0 | 0 | 1 | 0 | 1 | 0 | 1 | 1 | 0.882 | 2.322 |
| 1 | 1 | 0 | 1 | 0 | 1 | 1 | 0 | 1 | 2.322 | 1.062 |
| 1 | 0 | 0 | 1 | 1 | 0 | 1 | 1 | 0 | 1.062 | 2.502 |
| 1 | 1 | 0 | 1 | 1 | 1 | 1 | 0 | 0 | 2.502 | 1.242 |
| 1 | 0 | 1 | 0 | 0 | 1 | 1 | 0 | 1 | 1.242 | 2.682 |
| 1 | 1 | 1 | 0 | 0 | 0 | 1 | 1 | 0 | 2.682 | 1.422 |
| 1 | 0 | 1 | 0 | 1 | 1 | 1 | 1 | 0 | 1.422 | 2.862 |
| 1 | 1 | 1 | 0 | 1 | 0 | 1 | 0 | 0 | 2.862 | 1.602 |
| 1 | 0 | 1 | 1 | 0 | 1 | 0 | 1 | 1 | 1.602 | 3.042 |
| 1 | 1 | 1 | 1 | 0 | 0 | 1 | 1 | 1 | 3.042 | 1.782 |
| 1 | 0 | 1 | 1 | 1 | 1 | 0 | 0 | 0 | 1.782 | 3.22 |
| 1 | 1 | 1 | 1 | 1 | 0 | 0 | 0 | 0 | 3.22 | 1.962 |

Q3_Next = Q3Bar + Q2.Q1.Q0

Q2_Next = Q3Bar.Q2 + Q3Bar.Q2 + Q2.Q1.Q0Bar + Q2.Q1.Q0Bar + Q3.Q2Bar.Q1.Q0

Q1_Next = Q1.Q0Bar + Q3Bar.Q1 + Q3.Q1Bar.Q0

Q0_Next = Q3Bar.Q0 + Q3.Q0Bar

FIG. 4

FAST SETTLING CHARGE PUMP WITH FREQUENCY HOPPING

FIELD

Embodiments of the present disclosure relate generally to the field of circuits, and more particularly to an energy management core of a radio frequency switch device.

BACKGROUND

Charge pumps are designed to change an input signal at one voltage to an output signal at a lower or higher voltage. This voltage change may enable a single voltage of a power supply to be provided at varied voltages depending upon the circuit. For example, a power supply of a device may provide a voltage of 1.5 volts (v); however, a circuit in the device may need an operating voltage of −1.5 v. In order to provide this operating voltage the charge pump may take the 1.5 v provided by the power supply and convert it to the −1.5 v needed by the circuit.

A common method of converting the voltage is to utilize a switched mode power supply with switches that open and close at a specific clock signal frequency. This clock signal frequency may impact the output of the charge pump in a couple of ways. First, when a voltage is applied to a charge pump, it takes a period of time before the output voltage of the charge pump is capable of being used by the circuit to which the voltage is being provided. This period of time is known as the settling time of the charge pump and is dependent upon the frequency of the clock signal. A second issue involves spurious emissions. Spurious emissions are unintended frequencies that may be introduced into the output signal of the charge pump that were not present in the input signal. Spurious emissions, like settling time, are also dependent upon the clock signal frequency.

BRIEF DESCRIPTION OF THE DRAWINGS

Embodiments are illustrated by way of example and not by way of limitation in the figures of the accompanying drawings, in which like references indicate similar elements.

FIG. 4 depicts states of a counter and corresponding frequencies of an oscillator, according to some embodiments of the present disclosure.

DETAILED DESCRIPTION

Figure 1:
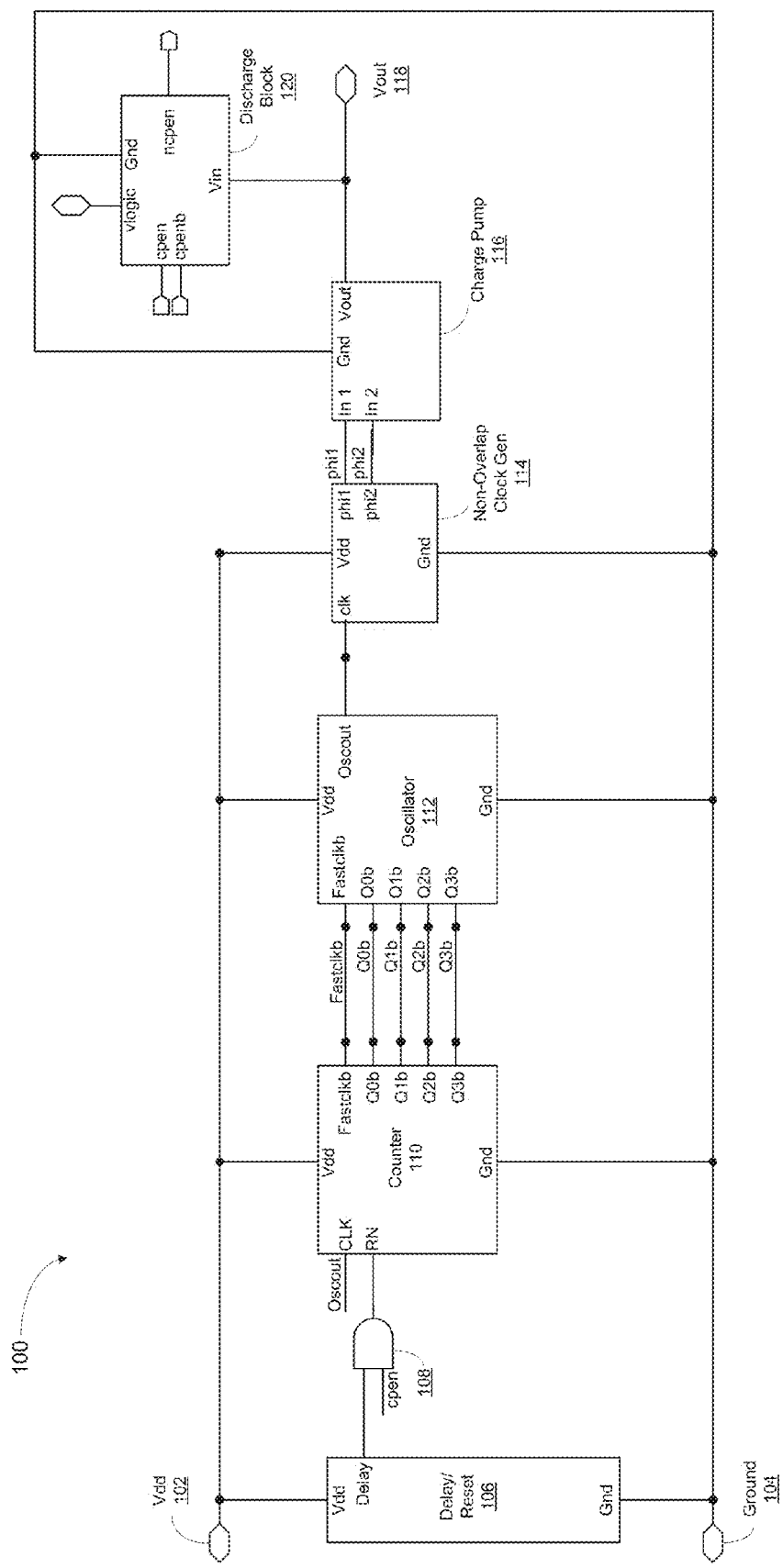
FIG. 1 depicts an illustrative energy management core, according to some embodiments of the present disclosure.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments. In the circuit schematics some physical connection lines may be omitted so as not to over-complicate the schematics. In these instances where a labeled input is shown matching a labeled output the input and output may be coupled together even if a physical connection is not depicted.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

As discussed herein, settling time may refer to the time period it takes for a charge pump to reach an output voltage within 5% to 2% of its target output voltage.

The output signal of a component may be referred to as Q and QBar herein, where Q represents the name of an output. As used herein Q and QBar may be opposite one another. For example, if Q is a high signal then QBar may be low. Furthermore, in some instances Bar may be shortened to a 'b.' Therefore, an output having either 'Bar' or 'b' at the end are equivalent unless the context indicates otherwise. For example, QBar would be equivalent to Qb unless the context indicates otherwise.

Embodiments may include a circuit, employed in an energy management core of a switch device. The circuit may comprise a frequency generator and a charge pump coupled with respective terminals. The switch device may be a silicon-on-insulator ("SOI") switch device. The frequency generator may be configured to provide the charge pump with a clock signal at a first frequency for a predefined period of time. Thereafter, the frequency generator may provide the charge pump with a clock signal at one or more other frequencies. In embodiments, the first frequency may enable the charge pump to settle in a reduced period of time when compared with the one or more other frequencies. Various embodiments will be described in further detail below with reference to the figures.

FIG. 1 depicts an illustrative energy management core circuit 100, according to some embodiments of the present disclosure. The energy management core may have a positive voltage Vdd 102 provided to power the circuit. In embodiments, the energy management core may include a delay/reset 106 to enable a delay, upon power on of the circuit, to ensure the energy management core circuit 100 may be properly reset and that a prior state may not be maintained. Delay/reset 106 may be coupled with a frequency generator, depicted here as counter 110 and oscillator 112. An AND gate 108 may act to ensure that both the delay signal and a cpen signal may be high prior to applying a high reset enable signal to the counter 110.

Reset enable, RN, of counter 110 may be coupled with AND gate 108 while clock, CLK, of counter 110 may be coupled with the output of oscillator 112, Oscout. Counter 110 may provide various signals, such as fastclkb and Q0b-Q3b, as input to oscillator 112. In embodiments, fastclkb and Q0b-Q3b may work to change a state associated with oscillator 112, such as a frequency associated with output, Oscout, of oscillator 112. For example, fastclkb may enable oscillator 112 to output oscout at a first frequency for a first portion of time and one or more other frequencies thereafter. The one or more other frequencies thereafter may be determined by the values of Q0b-Q3b. The relationship between the counter and the oscillator is discussed in greater detail below. In embodiments, the first frequency may enable charge pump 116 to settle in a shorter period of time and the one or more other frequencies may be selected to reduce power consumption and/or spurious emissions of the circuit as compared with persistent application of the first frequency. For example, the first frequency may be higher than the one or more other frequencies, as the settling time of charge pump 116 may be directly related to the frequency applied to charge pump 116. Charge pump 116, as depicted herein, may be either a positive or negative charge pump, this disclosure is equally applicable to both.

Oscillator 112 may be coupled with non-overlap clock gen 114 which may generate non-overlapping clock signals, phi 1 and phi 2. Charge pump 116 may be coupled with non-overlap clock gen 114 taking as a first and second input phi 1 and phi 2, respectively. Phi 1 and phi 2 may be provided to charge pump 116 at one voltage and output by charge pump 116 at a second voltage, Vout 118. Discharge block 120 may be utilized to discharge any voltage present in the energy management core 100 once the circuit is powered down.

Figure 2:
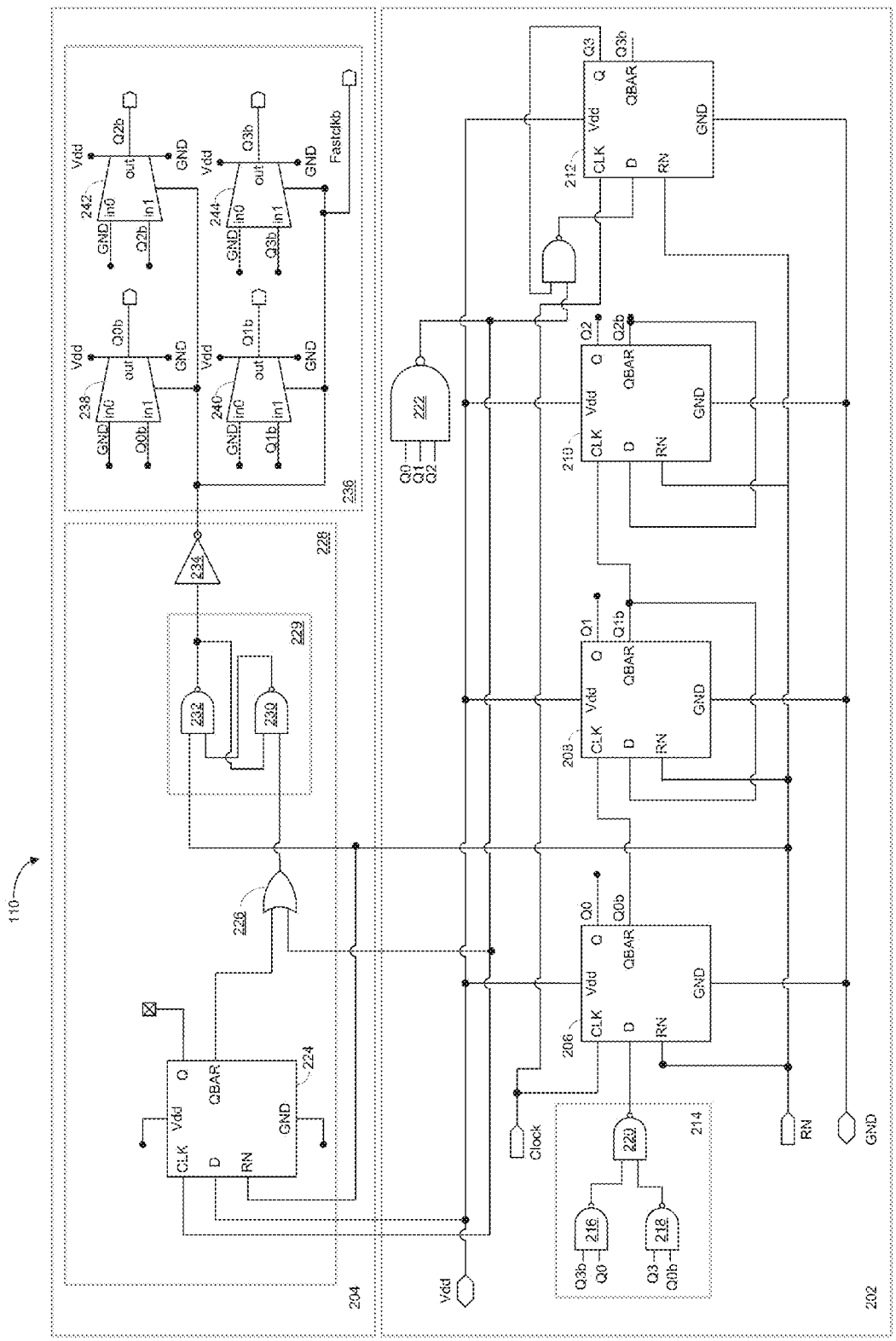
FIG. 2 depicts an illustrative counter, according to embodiments of the present disclosure.

FIG. 2 depicts an illustrative implementation of counter 110 of FIG. 1, according to some embodiments of the present disclosure. Counter 110 may have a voltage supply, such as Vdd, and ground, such as GND. In addition, counter 110 may take as input a reset enable signal, such as RN, and a clock signal. For ease of understanding, counter 110 may be conceptually divided into a four-bit counter 202 and an output control circuit 204. The logic of the four-bit counter 202 may follow the pattern depicted in FIG. 4, which is discussed in greater detail below. The logic of the output control circuit 204 may act to block output of the signals from the four-bit counter 202 for a first period of time and thereafter allow the signals to pass through. As discussed above in reference to FIG. 1, this may enable the counter to provide one signal for a first period of time and one or more other signals thereafter. The gates and flip-flops depicted herein perform their normal functions and therefore the logic of the circuit may not be discussed in extensive detail.

Four-bit counter 202 may be comprised of four 'd' flip-flops 206-212, hereinafter flip-flops, where each flip-flop corresponds with a single bit of the four-bit counter 202. The four-bit counter 202, as depicted here, may follow the states and state chart depicted in FIG. 4 and discussed in further detail below. Each flip flop may take as input a clock signal, CLK, a reset enable signal, RN, and an input value, D. The input value may be captured by the flip-flop depending upon the state of the flip-flop's respective clock signal at the time of the input value. For example, flip-flop 206 may take the clock signal coming into counter 110 as input and may take an input value based upon the logic in block 214. The input provided by the logic in block 214 may enable flip flop 206 to follow a specific state pattern. For instance, as depicted here, the signal output from block 214 may enable flip-flop 206 to follow the state equation Q0_Next=Q3 Bar.Q0+Q3.Q0 Bar of FIG. 4, where the "." represents Boolean multiplication operations and the "+" indicates Boolean addition. The equation for Q0_Next depicts the next state of the Q output of flip flop 206, Q0. The remaining flip-flops of the four-bit counter, flip-flops 208-212, may have input logic to enable the flip-flops to follow the state patterns for Q1_Next through Q3_Next, of FIG. 4, respectively.

Output control circuit 204 may be configured to provide a first output signal during a first period of time and one or more additional output signals thereafter. Output control circuit 204 may also be divided conceptually into two portions, output logic block 228 and a bank of transmission gates 236. Output logic block 228 may be comprised of a flip-flop 224 coupled with a latch 229 via an OR gate 226 and an output signal may be inverted prior to leaving output logic block 228 by inverter 234. Latch 229 may include NAND gates 230 and 232 coupled together to form a latch. The output logic block may cause a first signal to be stored in latch 229 for a first period of time, e.g., a first full iteration of the four-bit counter 202, and thereafter may cause a second signal to be stored in latch 229 until the circuit is powered down. For example, latch 229 may store a high signal for the first full iteration of the four-bit counter 202 and thereafter a low signal thus causing a low signal to be output for the first full iteration of four-bit counter 202 and a high signal thereafter.

The bank of transmission gates in block 236 may take as input the signal output from output logic block 228 along with the QBAR signals, Q0b-Q3b, output from flip-flops 206-212, respectively. As depicted here, each of transmission gates 238-244 may take Q0b-Q3b, respectively, as the high input, e.g., in1, ground as the low input, e.g., in 0, and the signal from output logic block 228 as a control signal of the transmission gates 238-244. As a result, when the control signal is low, the transmission gates may allow the ground input to pass through and may block Q0b-Q3b and, when the control signal is high, transmission gates may block the ground and allow signals Q0b-Q3b to pass through. Therefore, because the control signal may be low for the first full iteration of four-bit counter 202, the transmission gates may allow the ground to pass through and may allow Q0b-Q3b to pass through thereafter.

It will be appreciated that counter 110 depicted in FIG. 2 may be implemented in a variety of ways and the schematic representation of the circuit in FIG. 2 is merely meant as an example. For example, the four-bit counter 202 could just as easily be replaced with a counter with fewer or more bits and may be configured to follow any sequence or pattern. In embodiments, four-bit counter 202 may be replaced with logic to produce a single signal that may cause the oscillator to operate at a single frequency and the output control circuit 204 may be configured to provide a first signal to the oscillator for a first period of time and thereafter provide the single signal to the oscillator. In these embodiments, the first signal may be selected to reduce the settle time of the charge pump and the single signal may be selected to reduce the power consumption of the oscillator when compared with persistent application of the first signal. In other embodiments, the four-bit counter could be implemented as an eight-bit counter, or more, to provide, for example, a more complex pattern of signals to the oscillator. Any implementation of counter 110 which provides a first signal to an oscillator for a first period of time and one or more signals thereafter is contemplated by this disclosure.

Figure 3:
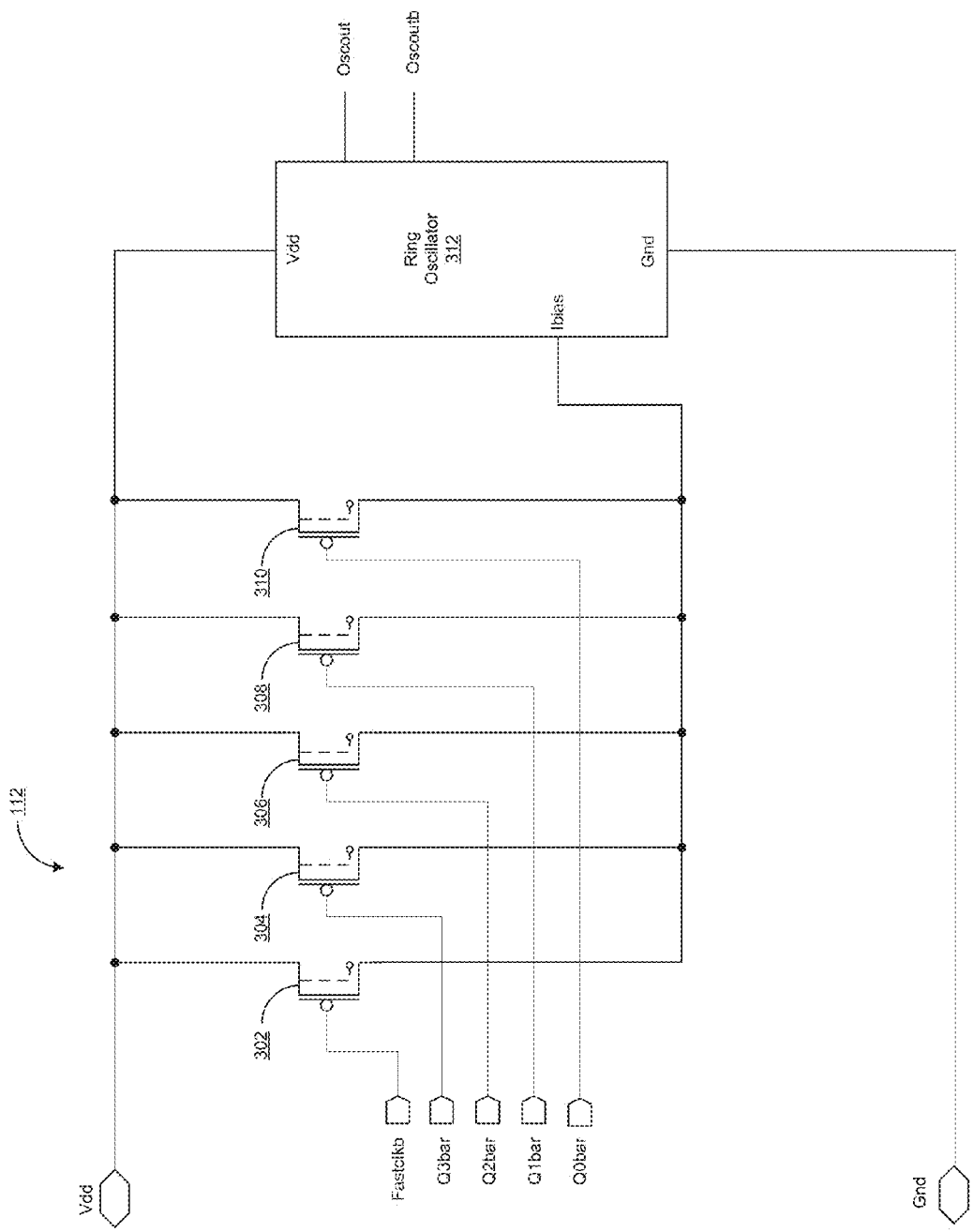
FIG. 3 depicts an illustrative oscillator, according to embodiments of the present disclosure.

FIG. 3 depicts an illustrative oscillator 112 of FIG. 1, according to embodiments of the present disclosure. Oscillator 112 may include bias current steering switches, 302-310. Bias current steering switches 302-310 may take fastclkb, Q3bar, Q2bar, Q1bar, and Q0bar, respectively, as inputs. The bias current steering switches may act to adjust the current provided to Ibias of ring oscillator 312 by adjusting the amount of current flowing into Ibias. In some embodiments, each of the bias current steering switches may have a different binary-weight and therefore each bias current steering switch may allow a different amount of current to pass through to ring oscillator 312. The frequency generated for output by ring oscillator 312 may therefore be adjusted based upon the inputs provided, fastclkb and Q0bar-Q3bar. The ring oscillator of this figure is merely meant to be an example. It will be appreciated that any oscillator capable of performing the frequency changes discussed is contemplated and not beyond the scope of this disclosure.

FIG. 4 depicts states of a counter, such as counter 110 of FIGS. 1 and 2, and corresponding frequencies of an oscillator, such as oscillator 112 of FIGS. 1 and 3. The first column represents the value of fastclkb output by the counter. The next four columns depict the respective states of Q3, Q2, Q1, and Q0 of FIG. 2. The next four columns depict the states that Q3, Q2, Q1, and Q0 may go to at a next clock cycle. The Freq1 column represents the frequency of the signal provided by an oscillator that may be receiving the signal depicted by the combination of fastclkb, Q3, Q2, Q1, and Q0 while the Freq2 column depicts the frequency of the oscillator when receiving the signal depicted by Q3_Next, Q2_Next, Q1_Next and Q0_Next. In other words Freq2 represents the frequency the oscillator may transition to in its next state after Freq1.

For ease of understanding, the first time period, where a first signal may be applied to the oscillator, is represented by a single row 402. This first row may span any time duration sufficient for a charge pump, e.g. 116 of FIG. 1, to settle. In some embodiments, the time duration spanned by row 402 may be a full iteration of the associated counter. This embodiment may be depicted by the logic of the counter of FIG. 2. During this time period a frequency selected for fast settling may be applied to the charge pump and thereafter one or more other frequencies may be applied.

As depicted in row 402 fastclkb may be 0, implying that fastclk may be 1, and the frequency generated by the oscillator may be 7 megahertz (Mhz). As depicted by the simulation graphs of FIG. 4, a 7 Mhz frequency allows for a settle time of approximately 5 microseconds (μs). It will be appreciated that the 7 Mhz frequency is selected as merely an example and other frequencies may be selected depending upon application. For instance, a faster frequency may allow for a further reduction in settle time; however, a faster frequency may also cause the oscillator to consume more energy. In other instances, a slower frequency may be used that may result in an increased settle time, but may consume less energy. All of these instances are contemplated by this disclosure.

At 404 the four-bit counter may begin its second iteration and may continue cycling through the pattern depicted by the rows between, and including, 404-408, including those rows without an associated reference number. As can be seen, each different state of the counter may cause a different frequency to be generated by the oscillator. These frequencies may be selected for varying purposes. In some embodiments, and as depicted here, the cycle of frequency adjustments may act to reduce spurious emissions of a circuit such as that depicted in FIG. 1, such a cycle may be referred to as a uniform dithering cycle. In a uniform dithering cycle the frequencies may be uniformly cycled through such that the overall frequency effect of the dithering pattern may be an average of the applied frequencies. Such a dithering cycle may allow for a smaller die size than might be capable when handling spurious emissions via filtering capacitors because the filtering capacitors may take up additional space on the die.

The states depicted in the chart may also be arrived at utilizing state equations 410-416. For instance, in row 404 Q3=0, Q2=0, Q1=0, and Q0=0. The next state may be derived from this current state. For example, Q3_Next=Q3 Bar+Q2.Q1.Q0. When the above discussed values are plugged into this equation the next value for Q3 may be derived. In this instance Q3_Next=1+0.0.0=1 which matches Q3_Next depicted in row 404. The remaining equations, 412-416, may be applied in the same manner.

It will be appreciated that the dithering cycle depicted in FIG. 4 may represent one embodiment of this disclosure. In other embodiments, a different manner of dithering, such as pseudo-random number dithering, may be used. In still other embodiments a dithering cycle may not be desirable and instead a first frequency, such as the 7 Mhz frequency depicted in FIG. 4, may be used to settle the charge pump and a second frequency may be applied thereafter to reduce the power consumption of the circuit over persistent application of the 7 Mhz frequency. In embodiments where dithering is not used, filtering capacitors may be used to reduce spurious emissions.

Figure 5:
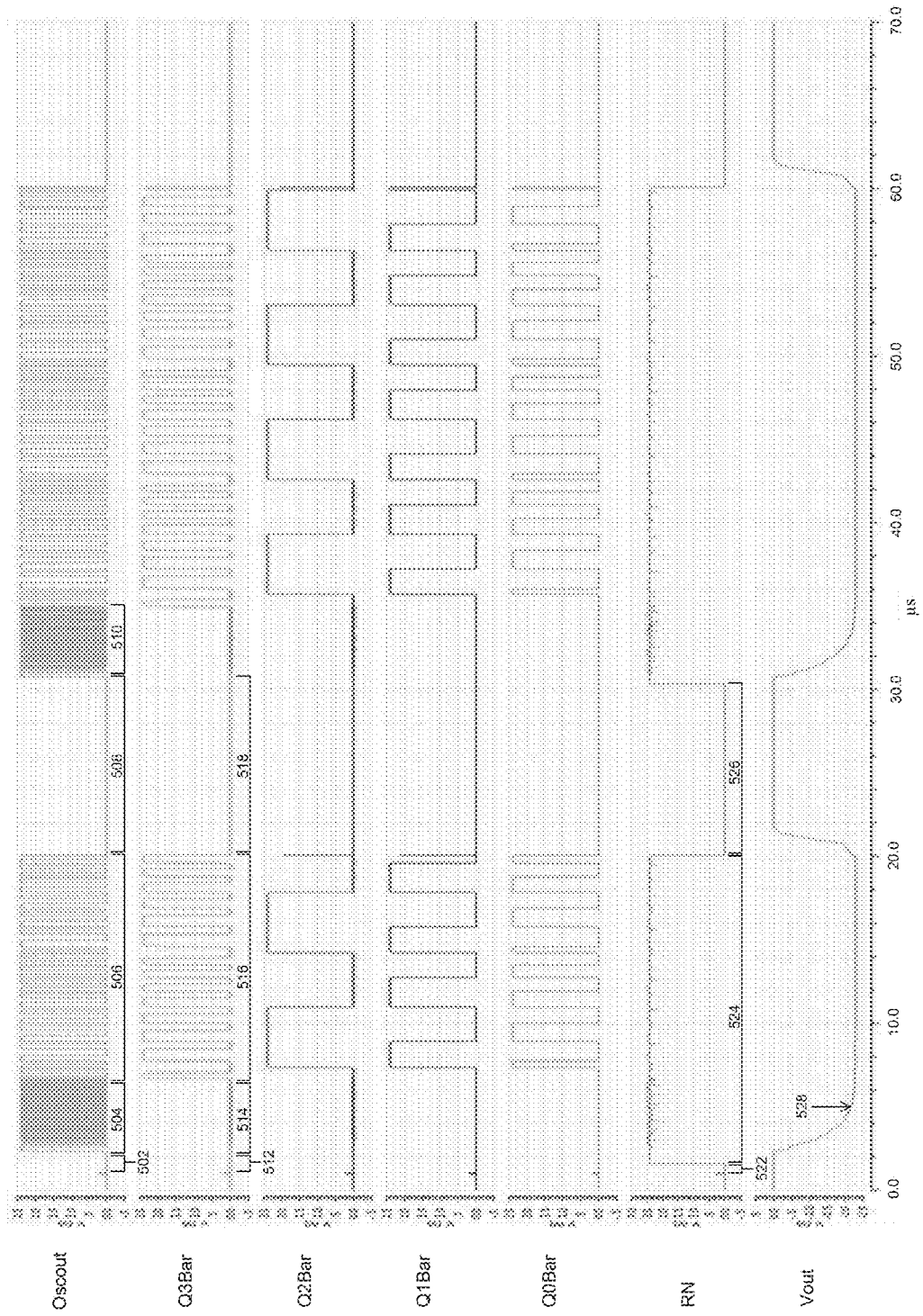
FIG. 5 depicts a simulation of an energy management core circuit.

FIG. 5 depicts a simulation of an energy management core 100 of FIG. 1 that may utilize the counter depicted in FIG. 2 and the oscillator depicted in FIG. 3. The vertical axis represents voltage of the signal while the horizontal axis represents time in microseconds (μs). The first graph, oscout, depicts the output of the oscillator when the counter is in the states depicted by the Q3 Bar, Q2 Bar, Q1 Bar, and Q0Bar graphs. As can be seen, during period 502 the oscillator does not output anything. This may be a result of the circuit powering on and the delay/reset 106 of FIG. 1. After the circuit is powered on, the oscillator outputs a high frequency signal, such as the 7 Mhz signal depicted in FIG. 4, for a first period of time, 504 and thereafter switches to one or more other frequencies for the remaining time period 506. Time period 508 may represent a period during which the circuit may have powered down and period 510 may depict the circuit powering up again and applying a high frequency. As depicted here, the one or more other frequencies may coincide with the uniform dithering pattern depicted in FIG. 4 and discussed above.

The Q3 Bar graph represents the state changes associated with the Q3 Bar output of the counter. As can be seen, there may be an initial phase 512 where the circuit may be powering on, just as that described above in reference to the oscout graph. Thereafter a period of time 514 represents the time period where the transmission gates of the counter are blocking the output of Q3 Bar, as discussed above in reference to FIG. 2. Thereafter, the transmission gates allow transmission of Q3 Bar during time period 516. As discussed above, during time period 518 the circuit is powered off and the cycle starts over again upon the circuit being powered on. These same time periods may be seen in the Q2 Bar, Q1 Bar, and Q0Bar graphs.

The RN graph reflects the reset enable signal that may be applied to energy management core 100. As is depicted in FIG. 4, the RN signal has a delay due to delay/reset 106 of FIG. 1 during time period 522. Thereafter the reset enable signal goes high for the remainder of the time that power is applied to the circuit represented here as time period 524. Time period 526 represents the power down of the circuit and then the sequence described above repeats itself upon power on of the circuit.

The graph representing Vout depicts the voltage output of a charge pump, such as charge pump 116 of FIG. 1. As is depicted here the charge pump settling time 528 may be approximately 5 μs. Thereafter, the charge pump maintains a relatively consistent voltage output. At approximately 20 μs power may no longer be applied to the circuit and the discharge of the charge pump through discharge block 120 of FIG. 1 can be seen from approximately 20 μs to 22 μs. Then at approximately 30 μs the charge pump again goes through the previously discussed settling time.

Figure 6:
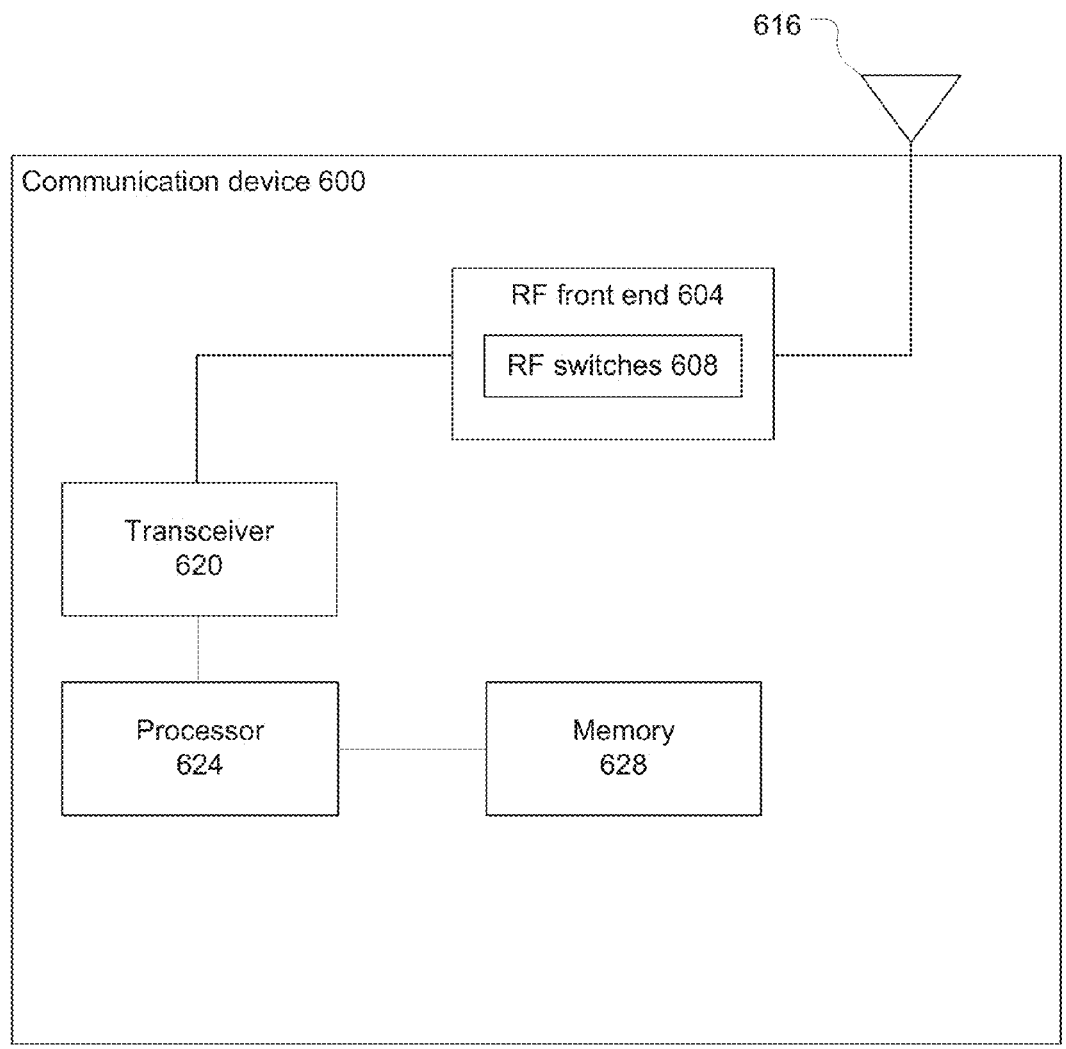
FIG. 6 depicts an illustrative wireless communication device, according to some embodiments of the present disclosure.

A wireless communication device 600 is illustrated in FIG. 6 in accordance with some embodiments. Wireless communication device 600 may have an RF front end 604 to provide various front-end functionality. The RF front end 604 may include one or more RF switches 608 to selectively pass RF signal(s) to/from, or within components of the wireless communication device 600. The RF switches 608 may include an energy management core similar to energy management core 100. The RF switches may include, but are not limited to, silicon on insulator (SOI) switches and/or pseudomorphic high-electron mobility transistor (PHEMT) switches. The RF switches 608 may be deployed in various elements of the RF front end 604 such as, but not limited to, an antenna switch module, a distribution switch, a transmitter, a receiver, etc. The RF front end 604 may also include other elements not specifically shown or discussed such as, but not limited to, amplifiers, converters, filters, etc.

In addition to the RF front end 604, the wireless communication device 600 may have an antenna structure 616, a transceiver 620, a processor 624, and a memory 628 coupled with each other at least as shown.

The processor 624 may execute a basic operating system program, stored in the memory 628, in order to control the overall operation of the wireless communication device 600. For example, the main processor 624 may control the reception of signals and the transmission of signals by transceiver 620. The main processor 624 may be capable of executing other processes and programs resident in the memory 628 and may move data into or out of memory 628, as desired by an executing process.

The transceiver 620 may receive outgoing data (e.g., voice data, web data, e-mail, signaling data, etc.) from the processor 624, may generate RF signal(s) to represent the outgoing data, and provide the RF, signal(s) to the RF front end 604. Conversely, the transceiver 620 may receive RF signals from the RF front end 604 that represent incoming data. The transceiver 620 may process the RF signals and send incoming signals to the processor 624 for further processing.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 600 is given by way of example and that, for simplicity and clarity, only so much of the construction and operation of the wireless communication device 600 as is necessary for an understanding of the embodiments is shown and described. Various embodiments contemplate any suitable component or combination of components performing any suitable tasks in association with wireless communication device 600, according to particular needs. Moreover, it is understood that the wireless communication device 600 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
   a radio frequency (RF) switch having an energy management core, wherein the energy management core includes:
   a charge pump; and
   an oscillator coupled with the charge pump, wherein the oscillator provides a clock signal to the charge pump, and the oscillator is configured to generate the clock signal at a predefined frequency based upon an input signal received by the oscillator; and
   a counter coupled with the oscillator, wherein the counter provides the input signal to the oscillator, and the counter is configured to provide, to the oscillator, a first signal as the input signal to cause the oscillator to generate the clock signal at a first frequency for a predefined period of time and thereafter the counter is configured to provide a plurality of other signals as the input signal to cause the oscillator to generate the clock signal at a plurality of other frequencies in a pattern, wherein:
   the first frequency enables a reduction in settle time associated with the charge pump when compared with each of the plurality of other frequencies, and dithering the plurality of other frequencies in the pattern enables a reduction of spurious emissions.

2. The circuit of claim 1, wherein the one or more other signals are a plurality of signals and wherein the counter is further configured to, after the predefined period of time, cycle through the plurality of signals in the cycle to cause the oscillator to cyclically generate the clock signal at a respective plurality of frequencies.

3. The circuit of claim 2, wherein the plurality of signals and the plurality of frequencies, are cycled through in a predefined order that reduces spurious frequency emissions.

4. The circuit of claim 1, wherein application of the plurality of other frequencies results in a reduction in power consumption of the circuit as compared to a persistent application of the first frequency.

5. The circuit of claim 4, wherein the settle time associated with the charge pump is 5 microseconds (μs) or less when the charge pump is provided with a clock signal at the first frequency.

6. The circuit of claim 1, wherein the charge pump is a negative charge pump.

7. The circuit of claim 1, wherein the charge pump is a positive charge pump.

8. A communication device comprising:
a transceiver; and
a radio frequency (RF) switch, coupled with the transceiver, the radio frequency switch having an energy management core, wherein the energy management core includes:
a charge pump;
an oscillator coupled with the charge pump, wherein the oscillator provides a clock signal to the charge pump, and the oscillator is configured to generate the clock signal at a frequency based upon an input signal received by the oscillator;
a counter coupled with the oscillator, wherein the counter provides the input signal to the oscillator, and the counter is configured to provide, to the oscillator, upon power on of the energy management core, a first signal as the input signal to cause the oscillator to generate the clock signal at a first frequency for a predefined period of time, and thereafter the counter is configured to provide a plurality of other signals as the input signal to cause the oscillator to generate the clock signal at a plurality of other frequencies in a dithering pattern, wherein the first frequency enables a reduction in settle time associated with the charge pump when compared with each of the plurality of other frequencies, and the plurality of other frequencies in the dithering pattern enable a reduction of spurious emissions.

9. The communication device of claim 8, wherein the plurality of other signals are a plurality of signals and the counter is further configured to, after the predefined period of time, cycle through the plurality of signals, to cause the oscillator to cyclically generate the clock signal at a respective plurality of frequencies.

10. The communication device of claim 9, wherein the plurality of signals and the respective plurality of frequencies, are cycled through the dithering cycle in a predefined order that reduces spurious frequency emissions.

11. The communication device of claim 8, wherein the application of the plurality of other frequencies results in a reduction in power consumption of the energy management core as compared to a persistent application of the first frequency.

12. The communication device of claim 11, wherein the settle time associated with the charge pump is 5 microseconds (µs) or less when the charge pump is provided with a clock signal at the first frequency.

13. The communication device of claim 8, wherein the RF switch is a silicon on insulator (SOI) switch.

14. The communication device of claim 8, wherein the RF switch is a pseudomorphic high-electron mobility transistor (PHEMT) switch.

15. A method comprising:
providing a transceiver and an RF switch coupled with the transceiver, the RF switch having an energy management core;
providing, by a counter of the energy management core, upon power on of the energy management core, a first signal, during a first period of time, as an input signal to an oscillator of the energy management core, wherein the first signal is to cause the oscillator to generate a clock signal at a first frequency to be applied to a charge pump of the energy management core; and
providing, by the counter, after the first period of time, a plurality of other signals in a dithering pattern, as the input signal to the oscillator, to cause the oscillator to generate the clock signal at a plurality of other frequencies, wherein the first frequency is calculated to reduce a settle time associated with the charge pump when compared with each of the plurality of other frequencies, and the plurality of other frequencies in the dithering pattern enable a reduction of spurious emissions.

16. The method of claim 15, further comprising cycling through the plurality of signals, after the predefined period of time, to cause the oscillator to cyclically generate the clock signal at a respective plurality of frequencies in the dithering pattern.

17. The method of claim 16, wherein the plurality of signals and the respective plurality of frequencies in the dithering pattern, are cycled through in a predefined order that reduces spurious frequency emissions.

18. The method of claim 16, wherein the application of the plurality of other frequencies results in a reduction in power consumption of the energy management core as compared to a persistent application of the first frequency.

19. The method of claim 18, wherein the settle time associated with the charge pump is 5 microseconds (µs) or less when the charge pump is provided with a clock signal at the first frequency.

* * * * *